US006988882B2

(12) United States Patent
Boyaud et al.

(10) Patent No.: US 6,988,882 B2
(45) Date of Patent: Jan. 24, 2006

(54) TRANSFER MOLDING OF INTEGRATED CIRCUIT PACKAGES

(75) Inventors: Marie-France Boyaud, Bromont (CA); Catherine Dufort, Bromont (CA); Marie-Claude Paquet, Bromont (CA); Real Tetreault, Granby (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/209,156

(22) Filed: Aug. 22, 2005

(65) Prior Publication Data

US 2005/0275091 A1 Dec. 15, 2005

Related U.S. Application Data

(62) Division of application No. 10/681,513, filed on Oct. 8, 2003, now Pat. No. 6,956,296, which is a division of application No. 10/167,635, filed on Jun. 12, 2002, now Pat. No. 6,656,773.

(30) Foreign Application Priority Data

Jun. 15, 2001 (CA) .................................. 2350747

(51) Int. Cl.
*A23P 1/00* (2006.01)
(52) U.S. Cl. ..................................... 425/542
(58) Field of Classification Search ................ 425/542, 425/546, 588
See application file for complete search history.

(56) References Cited

U.S. PATENT DOCUMENTS 5,077,237 A * 12/1991 Hara ........................... 437/214
5,700,723 A * 12/1997 Barber ........................ 438/118
5,817,545 A 10/1998 Wang et al.
5,834,340 A * 11/1998 Sawai et al. ................. 438/126
5,981,312 A 11/1999 Farquhar et al.
5,998,243 A * 12/1999 Odashima et al. ........... 438/127
6,011,694 A * 1/2000 Hirakawa .................... 361/774
6,046,076 A * 4/2000 Mitchell et al. ............. 438/127
6,081,997 A 7/2000 Chia et al.
6,117,382 A * 9/2000 Thummel ............... 264/272.14
6,177,724 B1 * 1/2001 Sawai ......................... 257/701
6,306,688 B1 * 10/2001 Lunceford ................... 438/127
6,338,985 B1 * 1/2002 Greenwood ................. 438/126
6,413,801 B1 * 7/2002 Lin ............................. 438/127
6,432,751 B1 * 8/2002 Haji ........................... 438/124
6,455,349 B2 * 9/2002 Brand ......................... 438/106
6,498,054 B1 * 12/2002 Chiu et al. .................. 438/108
6,534,345 B1 * 3/2003 Muff et al. .................. 438/127

FOREIGN PATENT DOCUMENTS

EP          1 075 022 A1    2/2001

* cited by examiner

*Primary Examiner*—Scott Geyer

(74) *Attorney, Agent, or Firm*—William N. Hogg

(57) ABSTRACT

A method, mold and apparatus for encapsulating and underfilling an integrated circuit chip assembly. The mold has a first portion and a second portion with the first portion having first and second cavities and at least one channel interconnecting the first and second cavities. The first cavity is adapted to enclose the integrated circuit chip on the substrate. A clamping force is applied to the first and second portions of the mold to clamp the substrate between them with the integrated circuit chip located in the first cavity. Vents exhaust air from the first cavity. Encapsulant is injected into the first cavity of the first portion at a location in the first portion remote from the point of connection of the channel such that encapsulant flows around and underneath the integrated circuit chip and through the channel into the second cavity to thereby underfill and encapsulate the integrated circuit assembly.

16 Claims, 4 Drawing Sheets

TRANSFER MOLDING OF INTEGRATED CIRCUIT PACKAGES

CROSS-REFERENCE TO RELATED APPLICATION

This application is a divisional of application Ser. No. 10/681,513, filed Oct. 8, 2003 now U.S. Pat. No. 6,956,296, which is a divisional of application Ser. No. 10/167,635, filed Jun. 12, 2002, now U.S. Pat. No. 6,656,773 B2.

FIELD OF THE INVENTION

This invention relates to an improved method of the use of transfer molding for encapsulating and underfilling integrated circuit chips attached to substrates to result in integrated circuit packages. It also relates to the mold and apparatus used in the improved method and the resultant integrated circuit assemblies.

BACKGROUND OF THE INVENTION

An integrated circuit chip assembly generally comprises an integrated circuit chip attached to a substrate, typically a chip carrier or a circuit board. The most commonly used integrated circuit chip is composed primarily of silicon having a coefficient of thermal expansion of about 2 to 4 ppm/° C. The chip carrier or circuit board is typically composed of either a ceramic material having a coefficient of thermal expansion of about 6 ppm/° C., or an organic material, possibly reinforced with organic or inorganic particles or fibers, having a coefficient of thermal expansion in the range of about 6 to 50 ppm/° C. One technique well known in the art for interconnecting integrated circuit chips and substrates is flip chip bonding. In flip chip bonding, a pattern of solder balls is formed on the active surface of the integrated circuit chip, allowing complete or partial population of the active surface with interconnection sites. The solder balls which typically have a diameter of about 0.002 to 0.006 inches, are deposited on solder wettable terminals on the active surface of the integrated circuit chip forming a pattern. A matching footprint of solder wettable terminals is provided on the substrate. The integrated circuit chip is placed in alignment with the substrate and the chip to substrate connections are formed by reflowing the solder balls. Flip chip bonding can be used to attach integrated circuit chips to chip carriers or directly to printed circuit boards. The terminals located on the side of the substrate facing the integrated circuit chip are in turn interconnected to connecting balls or pins on the opposite side of the substrate in a well known manner in order to facilitate the external connection of the assembly to contacts or terminals on, for example, a circuit board.

A feature of established practices in the integrated circuit industry, provides that the substrate with the attached integrated circuit chip are formed into a package by encapsulating the assembly into a unitary package. This provides physical and environmental protection for the delicate integrated circuit chip including isolating the integrated circuit chip and the interconnections from moisture. It also provides firm bonding between the integrated circuit chip and the substrate to thereby prevent relative movement between them and the potential disruption of the interconnections. During operation of an integrated circuit chip assembly, cyclic temperature excursions cause the substrate and the integrated circuit chip to expand and contract. Since the substrate and the integrated circuit chip have different coefficients of thermal expansion, they expand and contract at different rates, possibly causing the solder ball connections to weaken or even crack as a result of fatigue. To remedy this situation, it is common industry practice to reinforce the solder ball connections with a thermally curable polymer material known in the art as an underfill encapsulant.

Underfill encapsulants have been widely used to improve the fatigue life of integrated circuit chip assemblies consisting of an integrated circuit chip of the flip chip variety attached to a substrate made of alumina ceramic material having a coefficient of thermal expansion of about 6 ppm/° C. More recently, integrated circuit assemblies having an integrated circuit chip of the flip chip type attached to a substrate made of a reinforced organic material with a composite coefficient of thermal expansion of about 20 ppm/° C. have been manufactured.

During the packaging of the integrated circuit attached to the substrate, the underfill encapsulation process is typically accomplished by dispensing the liquid encapsulant at one or more points along the periphery of the integrated circuit chip. The encapsulant is drawn into the gap between the integrated circuit chip and the substrate by capillary forces, substantially filling the gap and forming a fillet around the perimeter of the integrated circuit chip. An example of such an underfilling method is described in U.S. Pat. No. 5,817,545, entitled "Pressurized Underfill Encapsulation Of Integrated Circuits", which issued Oct. 6, 1998.

The diameter of the filler particles in the encapsulant are sized to be smaller than the height of the gap so as not to restrict flow. Typical encapsulant formulations have a viscosity of about 10 Pa-s at the dispense temperature. After the encapsulant has flowed into the gap, it is cured in an oven at an elevated temperature.

Cured encapsulants typically have coefficients of thermal expansion in the range of about 20 to 40 ppm/° C., and a Young's Modulus of about 1 to 3 GPa, depending on the filler content and the polymer chemistry. It may be desirable in some cases to further alter the cured properties of the encapsulant, however, the requirement that the encapsulant have low viscosity in the uncured state severely restricts the formulation options. For example, the addition of more ceramic filler would lower the resulting coefficient of thermal expansion, but increase the uncured viscosity.

Known in the art are methods for encapsulation of a flip chip package wherein a package body is formed around the perimeter of the flip chip in a two step process. First the integrated circuit chip is underfilled as previously described for the packaging, and then a package body is formed around the perimeter of the integrated circuit chip using a molding process. In yet another known method, additional reinforcement is achieved by encapsulating both faces of the flip chip and its perimeter in a single step. In this technique, the gap between the integrated circuit chip and the substrate has been substantially eliminated by forming a hole in the substrate that comprises a significant portion of the active area of the integrated circuit chip. This approach essentially eliminates the small gap typical of a conventional integrated circuit chip to substrate interconnection, but has the drawback of limiting the active area of the integrated circuit chip that can be used for forming interconnections because only the perimeter of the integrated circuit chip can be used. Examples of descriptions of injection encapsulation making use of an opening in the substrate below the integrated circuit chip in order to encapsulate the interconnections are described in U.S. Pat. No. 6,081,997, entitled "System and Method For Packaging An Integrated Circuit Using Encapsulant Injection", which issued Jul. 4, 2000 and U.S. Pat. No.

5,981,312, entitled "Method For Injection Molded Flip Chip Encapsulation", which issued Nov. 9, 1999.

Another example of attempts to improve the encapsulation of integrated circuit packages is described in European patent application EP 1075022, entitled "Offset Edges Mold For Plastic Packaging Of Integrated Semiconductor Devices", which was published Feb. 7, 2001. In this application the description includes causing and directing the flow of plastic resin to the more restricted areas into the depressed central areas of the mold below where the device is located in a cavity as well as the upper part of the cavity above the device.

Notwithstanding the use of known underfill encapsulation techniques, fatigue life of an integrated circuit chip assembly may be shorter when the solder interconnections are made to organic substrates as opposed to ceramic substrates, owing to the greater mismatch in thermal expansion. Together with the limitations imposed on formulation options by the low viscosity requirement, improvements in encapsulation techniques and the mechanical reinforcement of integrated circuit chip interconnections are still required.

OBJECTS AND SUMMARY OF THE INVENTION

It is an object of the present invention to provide improved techniques resulting in a more uniform and controlled flow of encapsulant for more effectively removing air and minimizing moisture entrapment sites from the vicinity of an integrated circuit chip on a substrate during encapsulation.

It is another object of the present invention to provide a method for more efficiently and completely encapsulating an integrated circuit package than is presently available.

It is also an object of the present invention to provide a novel mold and apparatus for use in carrying out the aforementioned method as well as a resulting uniquely configured integrated circuit package product.

According to one aspect of the invention there is provided a method for encapsulating and underfilling an integrated circuit chip assembly comprising the steps of providing an integrated circuit assembly including an integrated circuit chip mounted on a substrate in a standoff relationship, providing a mold having a first cavity, a second cavity and at least one channel interconnecting the first and second cavities such that the at least one channel connects to the first cavity at least at one location, positioning the mold over the integrated circuit assembly such that the integrated circuit chip is located in the first cavity, applying a clamp force to hold the substrate against the mold, and injecting encapsulant into the first cavity of the mold remotely spaced from the point of connection of the at least one channel to the cavity, such that encapsulant flows around and underneath the integrated circuit chip and through the channel into the second cavity to thereby underfill and encapsulate the integrated circuit assembly.

According to another aspect of the invention there is provided a mold for encapsulating and underfilling an integrated circuit chip assembly. The mold comprises a first mold portion having first and second cavities and a channel interconnecting the first and second cavities, the first cavity being adapted for enclosing the integrated circuit chip on the substrate, a second mold portion, the first and second mold portions being adapted to clamp the substrate between the first and second portions with the integrated circuit chip located within the first cavity, a vent for exhausting air from the first cavity, and injecting structure for injecting encapsulant into the first cavity of the first mold portion at a location in the first portion remote from the point of connection of the channel to the first cavity, such that encapsulant flows around and underneath the integrated circuit chip and through the channel into the second cavity to thereby underfill and encapsulate the integrated circuit assembly.

According to another aspect of the invention there is provided an apparatus for encapsulating and underfilling an integrated circuit chip assembly including an integrated circuit chip mounted on a substrate in a standoff relationship. The apparatus comprises a mold having a first portion and a second portion, the first portion having first and second cavities and at least one channel interconnecting the first and second cavities, said first cavity being adapted to enclose the integrated circuit chip on the substrate, a vent for exhausting air from the first cavity, and injecting stricture for injecting encapsulant into the first cavity of the first portion at a location in the first portion remote from the point of connection of the channel to the first cavity, such that encapsulant flows around and underneath the integrated circuit chip and through the channel into the second cavity to thereby underfill and encapsulate the integrated circuit assembly.

According to yet another aspect of the invention there is provided an integrated circuit package which comprises an integrated circuit chip mounted on a top surface of a substrate in a standoff relationship, an encapsulant body adhering to the top surface of the substrate, encapsulating the chip and filling the standoff space between the chip and substrate, and at least one elongated encapsulant channel adhering to the top surface of the substrate and extending outwardly from the encapsulated chip.

The foregoing, together with other features and advantages of the present invention, will become more apparent when referring to the following specification of preferred embodiments of the invention and the accompanying drawings.

BRIEF DESCRIPTION OF THE DRAWINGS

For a more complete understanding of the present invention, reference is now made to the following detailed description of the embodiments illustrated in the accompanying drawings, wherein.

BEST MODE FOR CARRYING OUT THE INVENTION

Figure 1:
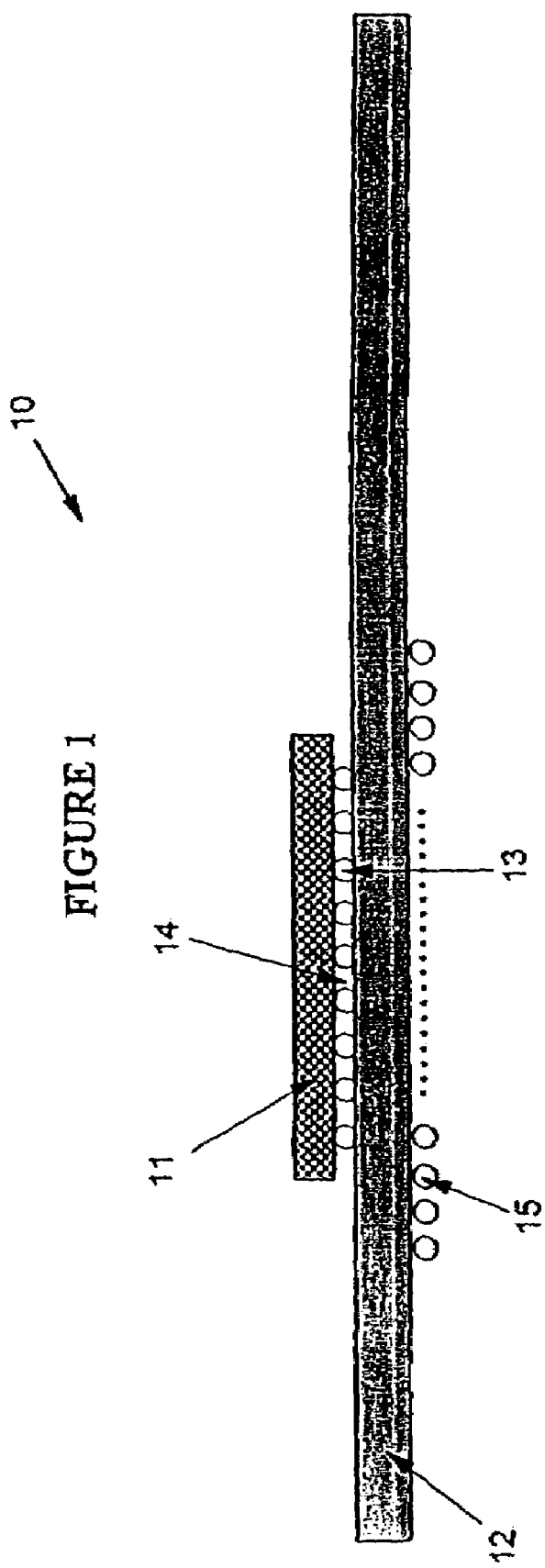
FIG. 1 is a diagrammatic cross-sectional view of an integrated circuit chip mounted on a carrier or substrate.

Proper encapsulation of a flip chip integrated circuit module with currently available transfer molding or overmolding encapsulating processes, raises a number of problems and thus is a generalized concern. It is, of course, desirable to encapsulate the flip chip module on a substrate to strengthen and reinforce the physical connections between the flip chip module and the substrate but at the same time, to ensure all air is removed to minimize humidity absorption and points of stress caused from any entrapped air. Underfill is desirable to reduce the stress on the solder joints resulting from the normal cycling of the module during operation and the different temperature coefficients of the module and the substrate to thereby prolong the fatigue life of the package before failure occurs. Any sharp corners of a mold could result in air being entrapped within the encapsulation and this is undesirable. Present processes tend to also cause restrictions which impact the possible design of the substrate and the positioning of the integrated circuit on the substrate. The features of the invention to be subsequently described are believed to overcome these known shortcomings in overmolding processes and provide for the encapsulation and underfilling of a flip chip module on a substrate with resin or plastic encapsulation resulting in a more useful and practical module.

The subsequent description provides for a special mold design that allows for more effective encapsulation of a flip chip module on a substrate using transfer molding processes than has been previously available. Amongst other features, this new mold design effectively controls the flow of the molding or encapsulating compound. The design eliminates undesirable knit lines which are formed when different flows of encapsulant meet and then solidify or cure resulting in irregularities in the final encapsulant, and overcomes other incomplete molding problems caused by unbalanced molding compound flow and entrapped air, and voids in the encapsulant. Throughout the following description each reference number is used to indicate the same feature or component in the drawings.

FIG. 1 depicts a diagrammatic cross-sectional view of a typical integrated circuit chip mounted on a carrier or substrate. Reference 10 refers generally to the combination of a flip chip or C4 chip 11 mounted on substrate 12. The bottom surface of flip chip 11 has an array of contact pads (which are not shown in the drawing) to each of which is attached a solder ball 13 which provides for a ball grid array corresponding to the contact array. The top surface of substrate 12 also has a corresponding array of contact pads (not shown in FIG. 1 but well known in the art) to which the array of solder balls 13 are attached using a conventional solder reflow process. Flip chip 11 is mounted on substrate 12 in a standoff relationship resulting in separation 14 between flip chip 11 and substrate 12. The contact pads on the top surface of substrate 12 are connected to corresponding contact pads on the bottom surface (not shown but also well known in the art) of substrate 12 by vial, for example, in a well known manner and each of the bottom contact pads have a connecting element attached thereto such as a solder ball or solder pin 15 which are then used to connect the package externally to a circuit board, for example, as is well known in the industry. It is modules of this type with which it is intended that features of the present invention can be beneficially used in order to create an encapsulated package.

Features of the mold to be used to encapsulate the integrated circuit assembly will now be described with reference to FIG. 2 which shows a diagrammatic, cross-sectional view of the circuit assembly of FIG. 1 and the mold of the invention.

The circuit assembly is shown using the corresponding reference numerals as in FIG. 1, namely flip chip 11, substrate 12, ball grid array 13, flip chip 11 oriented relative to substrate 12 in a standoff relationship, and space 14 between the chip and substrate resulting from the ball grid array connections.

Reference 20 refers to a diagrammatic representation of the first or upper portion of the mold. The mold portion 20 includes a first cavity 21 in which flip chip 11, mounted on substrate 12, is located. A second cavity or buffer cavity 22 is shown communicating with the first cavity 21 by channel 23. A second or lower portion of the mold 24 is shown against the bottom surface of substrate 12. The upper surface of mold portion 24 may be configured to have a number of longitudinal depressions or serrations so as to readily accommodate the connectors 15 (FIG. 1) and thereby overcome any damage or distortion to the connectors 15. This feature is not illustrated in FIG. 2.

It is appreciated that in practice, mold portion 20 and its indicated features could be designed to be the lower mold and mold portion 24 could be the upper mold. In other words, FIG. 2 could be essentially inverted to practice the invention.

Upper mold portion 20 is also designed to have strategic located encapsulant injection gates 25 and 26. Attached to these gates is apparatus 29 providing sources of encapsulant in a. manner as is well known to those of ordinary skill in the art.

Figure 4:
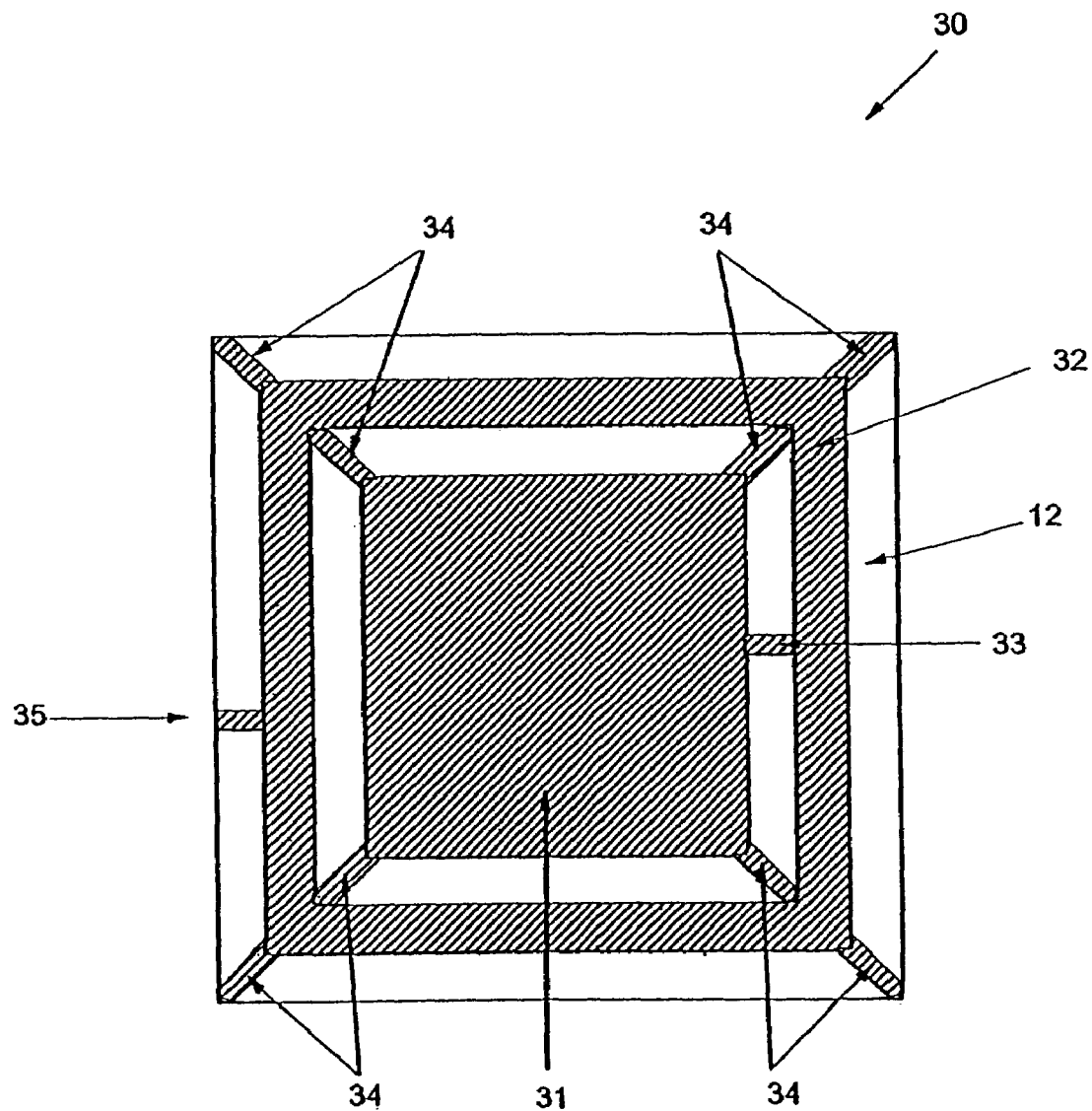
FIG. 4 is a diagrammatic top view of an encapsulated integrated circuit chip package in accordance with one aspect of the invention.

It is also understood that means for venting either or both of cavity 21 and cavity 22 is provided in mold portion 20 and to which a vacuum source could be attached in order to assist in exhausting air from the cavities and facilitating the filling of the cavities with encapsulant. In practice it is normally desirable to provide means for venting both cavity 21 and 22. Such vents, e.g., openings strategically located about the mold walls to which such vacuum devices can be attached, are well known to those of ordinary skill in the art and are not shown in FIG. 2. In FIG. 4, there are representative examples shown.

Figure 2:
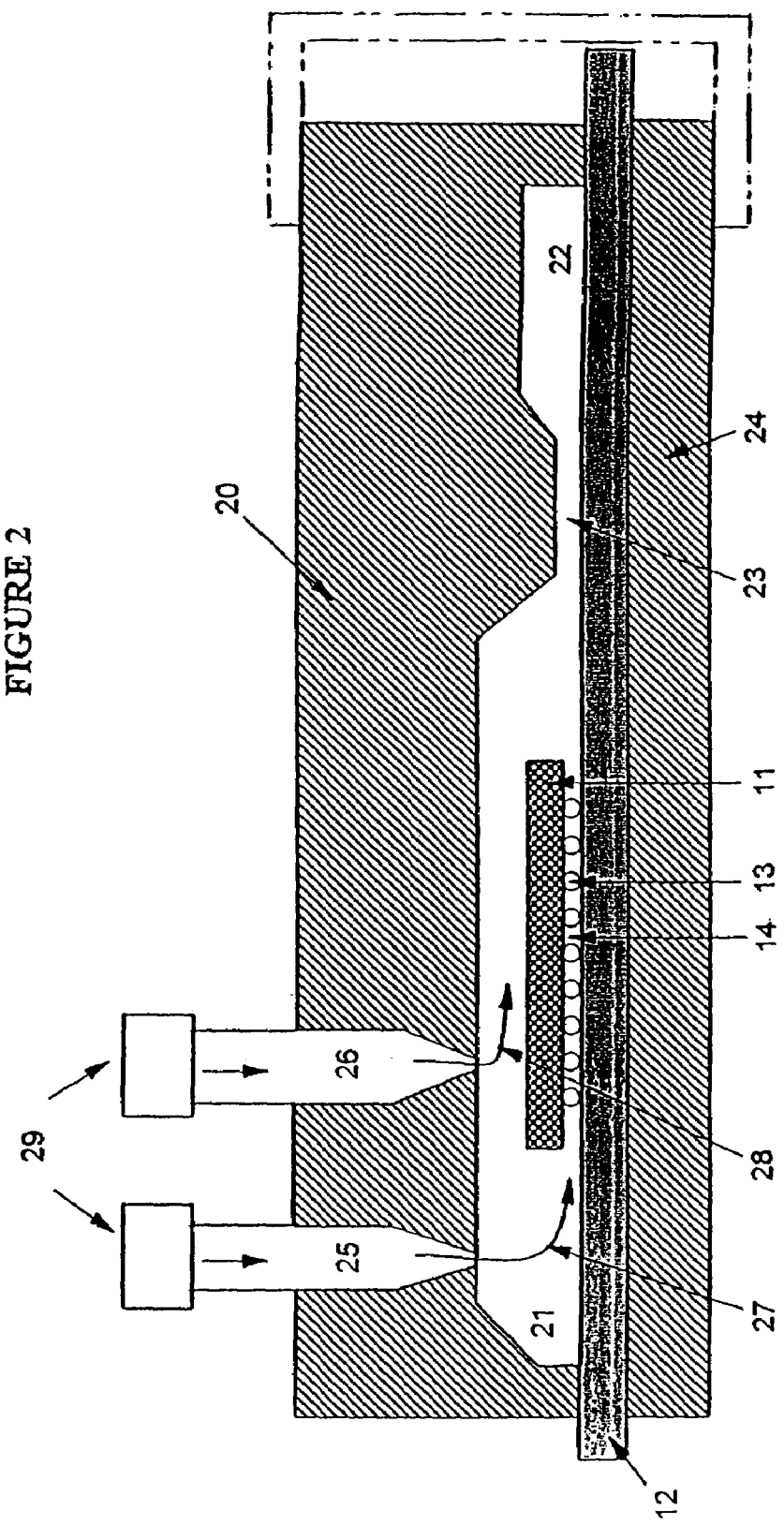
FIG. 2 is a diagrammatic cross-sectional view of upper and lower portions of a mold having the integrated circuit assembly of FIG. 1 within a cavity of the molds.

In operation of the apparatus as illustrated in FIG. 2, a clamping force is applied between mold portion 20 and mold portion 24 to hold substrate 12 in the configuration generally as illustrated and seal the mold portions 20 and 24 against substrate 12. An example of a clamp to accomplish this is shown in phantom in FIG. 2.

It has been found that in view of the restricted space between flip chip 11 and substrate 12 resulting from the standoff relationship, the narrow openings 14 and the multitude of C4 connections, that it is more difficult for encapsulant to flow into the separation between flip chip 11 and substrate 12 in order to properly underfill the space between flip chip 11 and substrate 12, and the encapsulant more readily flows in the more open areas above and around the chip. The present configuration overcomes this problem. Encapsulant from gate 25 is directed into cavity 21 so that it tends to flow under the flip chip 11 as shown by arrow 27. Alternatively, gate 26 is positioned generally over flip chip 11 so that encapsulant from gate 26 would tend to flow above and around the flip chip 11 as shown by arrow 28. In general, it is preferred that both gates 25 and 26 are opened at the same time in order to direct encapsulant in accordance with the arrows 27 and 28, respectively. In this way, spaces 14 and the underfilling of flip chip 11 is not impeded by prior encapsulant arriving over or around the flip chip 11 from gate 26. Of course, during operation, the means for venting cavities 21 and 22 are functioning so as to withdraw air from the cavities and enhance the advancement of the encapsulant. The two injection gates 25 and 26 in effect allow the molding compound to advance at relatively the same pace over and around the flip chip 11 as in the underfill area. Relatively thin channel 23 functions as a vent for first cavity 21 by drawing air from cavity 21. As encapsulant approaches channel 23 from cavity 21, channel 23 then acts as a gate to inject encapsulant into buffer cavity 22. The reduced thickness of the channel 23, as shown, also helps the molding compound to flow underneath flip chip 11 and underfill the gap area between flip chip 11 and substrate 12. Buffer cavity 22 permits the overflow of the faster advancing flow of encapsulant from the input gates into cavity 21 such that each of the two molding compound flows above, underneath and around the integrated circuit chip 11, reaches the end of the module cavity 21 more or less at the same time. In this way, the complete exhaustion of air from module cavity 21 and the complete filling of cavity 21 by encapsulant is assured. It has been found that the use of the apparatus as generally described in FIG. 2 minimizes and essentially eliminates the unbalanced molding compound flows around the flip chip 11 and eliminates undesirable pockets of air existing in module cavity 21 and thereby overcoming knit lines and incomplete encapsulations. As is apparent from FIG. 2, encapsulant input gates 25 and 26 are remotely positioned in cavity 21 from the location where channel or runner 23 connects with cavity 21. It is preferable if gates 25 and 26 are essentially positioned in the cavity opposite to this location of cavity 21. Only one channel 23 has been illustrated connecting cavity 21 and cavity 22, but as long as there is at least one channel 23, more than one channel could be used and incorporated into the method, mold and apparatus.

It is apparent from FIG. 2 that additional real estate of the surface of the substrate is utilized with this arrangement. However, if the circuit configuration warrants it, additional circuit components could be mounted on substrate 12 in the location of buffer cavity 22, thereby utilizing this additional substrate surface space.

After it is determined that cavity 22 is completely filled with encapsulant, the encapsulant source is discontinued from the gates 25 and 26 and the encapsulant is permitted to cure and harden prior to removal of the mold portions 20 and 24 as is known to those of ordinary skill in the art.

Figure 3:
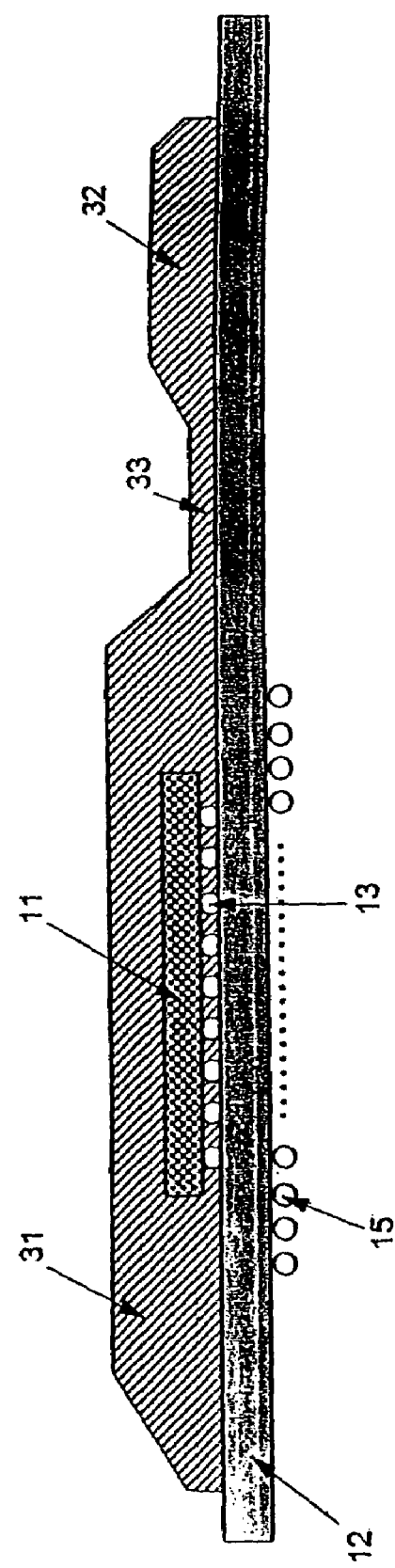
FIG. 3 a diagrammatic cross-sectional view of an encapsulated integrated circuit chip package according to one aspect of the invention.

FIG. 3 illustrates a cross-sectional view of an encapsulated, integrated circuit chip package 30 resulting from use of the apparatus and method as previously described with reference to FIG. 2. As previously described, flip chip 11 is shown connected to substrate 12 by ball grid array connectors 13. Connecting devices 15 on the bottom surface of substrate 12 and package 30 can then be used to interconnect the package to a circuit board, for example. Reference 31 indicates the encapsulant body resulting from the use of the mold portion 20 and cavity 21. Reference 32 refers to the encapsulant resulting from the mold portion 20 and cavity 22 and reference 33 refers to the encapsulant from the narrow channel or runner 23 of the mold portion 20. Encapsulant portion 33 is an elongated encapsulant channel adhering to the surface of substrate 12 and extending between encapsulated bodies 31 and 32 adhering to substrate 12.

As had been previously mentioned, the module or package 30 may be utilized in a circuit board in the configuration as shown, particularly if there are added circuit components in cavity 22. If this is not the case and there is no need for molded body 32 and molded channel 33 to remain as part of the package, the package could simply be reduced in size by breaking off channel portion 33 and cavity 32 so that the package would be rendered smaller in size so as to save real estate on the subsequent circuit board.

FIG. 4 illustrates a top view of another embodiment of an encapsulated integrated circuit package of the type of package illustrated and described with reference to FIG. 3, resulting from the subject invention. Substrate 12 supports an integrated circuit chip encapsulated within body 31. Encapsulated, thin channel 33 is shown connecting encapsulant body 31 to encapsulated buffer cavity 32. In this configuration, the encapsulated buffer cavity 32 is shown completely surrounding the encapsulated body 31. The numerous references 34 denote residue of encapsulant resulting from the molding process of typical vents for cavities 21 and 22, these vents located at the four corners of the rectangular mold assembly. Reference 35 is the residue of encapsulant resulting from the molding process of the vent where the flows of encapsulant meet and ends up after the encapsulant passes through channel 23 and into buffer cavity 22. This vent is located substantially opposite the singular channel 23 which connects the central cavity 21 and surrounding cavity 22. The traces of the encapsulant are shown by encapsulant body 32 in FIG. 4 and the vent corresponding to reference 35 would ensure air that is pushed ahead of the encapsulant flows is removed and expelled from cavity 22. Of course, it is understood the location and number of vents may vary as is know to those of ordinary skill in the art.

It is noted that the details of the embodiments illustrated in the drawings are not intended to be to scale and by what is illustrated in the drawings there is not intended to be any restriction on the number or size of components or elements. These have simply been provided as possible examples to explain the nature and features of the invention and may readily be varied in any practical manner as would be apparent to those of ordinary skill in this art. Preferred embodiments of the present invention have been described and illustrated above by way of example only and not of limitation, such that those of ordinary skill in the art will readily appreciate that numerous modifications of detail may be made to the present invention, all coming within its spirit and scope.

What is claimed is:

1. A mold for encapsulating and underfilling an integrated circuit chip assembly including an integrated circuit chip mounted on a substrate in a standoff relationship, said mold comprising:

a first mold portion having first and second cavities and a channel interconnecting said first and second cavities, said first cavity being adapted for enclosing said integrated circuit chip on said substrate;

a second mold portion;

said first and second mold portions being adapted to clamp the substrate between the first and second portions with the integrated circuit chip located within said first cavity;

a vent for exhausting air from said first cavity; and injecting structure for injecting encapsulant into said first cavity of said first mold portion at two spaced locations in said first portion remote from the point of connection of said channel to said first cavity generally in the direction toward said channel, such that encapsulant flows around and underneath said integrated circuit chip and through said channel into said second cavity to thereby underfill and encapsulate said integrated circuit assembly.

2. A mold for encapsulating and underfilling an integrated circuit chip assembly according to claim 1 wherein said injecting structure includes first and second inlet gates such that said first inlet gate is located over said integrated circuit chip and said second inlet gate is located beside said integrated circuit chip.

3. A mold for encapsulating and underfilling an integrated circuit chip assembly according to claim 1 wherein said first and second mold portions are upper and lower mold portions respectively.

4. A mold for encapsulating and underfilling an integrated circuit chip assembly according to claim 1 wherein said injecting structure also causes encapsulant to flow over said integrated circuit chip.

5. A mold for encapsulating and underfilling an integrated circuit chip assembly according to claim 1 wherein said vent also is adapted for exhausting air from said second cavity.

6. The invention as defined in claim 1, wherein one of said locations for injecting encapsulant being in the vicinity of the top of the integrated circuit chip, and the other location being in the vicinity of the space between the integrated circuit chip and the substrate, such that encapsulant flows around and underneath the integrated circuit chip and through the channel into said second cavity to thereby underfill and encapsulate said integrated circuit assembly.

7. The invention according to claim 1 wherein said integrated circuit chip is a flip chip having contacts on one side thereof interconnected with contacts on one side of said substrate by solder balls.

8. The invention according to claim 1 including a vacuum device positioned to draw air from within said first and second cavities.

9. Apparatus for encapsulating and underfilling an integrated circuit chip assembly including an integrated circuit chip mounted on a substrate in a standoff relationship, said apparatus comprising:

a mold having a first portion and a second portion;

said first portion having first and second cavities and at least one channel interconnecting said first and second cavities;

said first cavity being adapted to enclose said integrated circuit chip on said substrate;

a vent for exhausting air from said first cavity; and injecting structure for injecting encapsulant into said first cavity of said first portion at two spaced locations in said first portion remote from the point of connection of said at least one channel to said first cavity generally in the direction toward said at least one channel, such that encapsulant flows around and underneath the integrated circuit chip and through at least one channel into said second cavity to thereby underfill and encapsulate said integrated circuit assembly.

10. Apparatus according to claim 9 in which said first and second portions of the mold are upper and lower portions, respectively, of said mold.

11. Apparatus according to claim 9 wherein said vent is also adapted for exhausting air from said second cavity.

12. Apparatus according to claim 9 wherein said injecting structure for injecting encapsulant into said first cavity includes first and second inlet gates wherein said first inlet gate is located over said integrated circuit chip and said second inlet gate is located beside said integrated circuit chip.

13. The invention according to claim 9 wherein said integrated circuit chip is a flip chip having contacts on one side thereof interconnected with contacts on one side of said substrate by solder balls.

14. The invention according to claim 9 including a vacuum device positioned to draw air from within said first and second cavities.

15. A mold for encapsulating and underfilling an integrated circuit chip assembly according to claim 9 wherein said injecting structure also causes encapsulant to flow over said integrated circuit chip.

16. The invention as defined in claim 9, wherein one of said locations for injecting encapsulant being in the vicinity of the top of the integrated circuit chip, and the other location being in the vicinity of the space between the integrated circuit chip and the substrate, such that encapsulant flows around and underneath the integrated circuit chip and through the channel into said second cavity to thereby underfill and encapsulate said integrated circuit assembly.

* * * * *